United States Patent
Jia et al.

(10) Patent No.: US 10,615,073 B2
(45) Date of Patent: Apr. 7, 2020

(54) METHOD FOR REMOVING BARRIER LAYER FOR MINIMIZING SIDEWALL RECESS

(71) Applicant: ACM Research (Shanghai) Inc., Shanghai (CN)

(72) Inventors: Zhaowei Jia, Shanghai (CN); Jian Wang, Shanghai (CN); Hui Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 28 days.

(21) Appl. No.: 15/550,960

(22) PCT Filed: Feb. 15, 2015

(86) PCT No.: PCT/CN2015/073088
§ 371 (c)(1),
(2) Date: Aug. 14, 2017

(87) PCT Pub. No.: WO2016/127425
PCT Pub. Date: Aug. 18, 2016

(65) Prior Publication Data
US 2018/0025940 A1  Jan. 25, 2018

(51) Int. Cl.
*H01L 21/768* (2006.01)
*H01L 21/66* (2006.01)
(Continued)

(52) U.S. Cl.
CPC .. *H01L 21/76865* (2013.01); *H01L 21/31055* (2013.01); *H01L 21/32135* (2013.01);
(Continued)

(58) Field of Classification Search
None
See application file for complete search history.

(56) References Cited

U.S. PATENT DOCUMENTS 5,990,020 A    11/1999  Ha
6,020,271 A     2/2000  Yanagida
(Continued)

FOREIGN PATENT DOCUMENTS

CN       101013678 A     8/2007
WO     2010/020092 A1    2/2010

OTHER PUBLICATIONS

International Search Report issued in PCT/CN2015/073088 dated Jun. 29, 2015 (2 pages).
(Continued)

*Primary Examiner* — Allan W. Olsen
(74) *Attorney, Agent, or Firm* — Osha Liang LLP

(57) ABSTRACT

Provided is a method for removing barrier layer for minimizing sidewall recess. The method comprises the following steps: introduce noble-gas-halogen compound gas and carrier gas into an etching chamber within which a thermal gas phase etching process is being performed for etching a barrier layer (206) on non-recessed areas of an interconnection structure (501); detect an end point of the thermal gas phase etching process (502), if the thermal gas phase etching process reaches the end point end point, then execute the next step; if the thermal gas phase etching process doesn't reach the end point, then return to the previous step; stop introducing the noble-gas-halogen compound gas and the carrier gas to the etching chamber (503).

13 Claims, 8 Drawing Sheets

(51) Int. Cl.
*H01L 21/3105* (2006.01)
*H01L 21/3213* (2006.01)
*H01L 21/311* (2006.01)

(52) U.S. Cl.
CPC .......... *H01L 21/7684* (2013.01); *H01L 22/12* (2013.01); *H01L 22/26* (2013.01); *H01L 21/31144* (2013.01); *H01L 22/20* (2013.01)

(56) References Cited

U.S. PATENT DOCUMENTS

| | | | |
|---|---|---|---|
| 6,194,323 B1* | 2/2001 | Downey | H01L 21/31116 216/47 |
| 6,965,468 B2* | 11/2005 | Huibers | B82Y 30/00 359/290 |
| 7,189,332 B2* | 3/2007 | Patel | H01J 37/32449 216/2 |
| 9,425,041 B2* | 8/2016 | Berry, III | H01L 21/02057 |
| 9,496,172 B2* | 11/2016 | Wang | H01L 21/32115 |
| 2003/0073302 A1* | 4/2003 | Huibers | B81C 1/00095 438/622 |
| 2004/0191937 A1* | 9/2004 | Patel | B81C 1/00793 438/21 |
| 2005/0227378 A1* | 10/2005 | Moise | H01L 21/31116 438/3 |
| 2006/0051881 A1* | 3/2006 | Ditizio | H01L 43/08 438/3 |
| 2006/0096705 A1* | 5/2006 | Shi | B81C 1/00476 156/345.33 |
| 2006/0189134 A1 | 8/2006 | Cotte et al. | |
| 2007/0241417 A1* | 10/2007 | Huibers | G02B 26/0841 257/436 |
| 2008/0147229 A1* | 6/2008 | O'Hara | B81C 1/00476 700/121 |
| 2010/0276783 A1* | 11/2010 | Cathey | H01L 27/0805 257/532 |
| 2011/0177692 A1 | 7/2011 | Wang et al. | |
| 2012/0244715 A1* | 9/2012 | Lebouitz | H01L 21/3065 438/706 |
| 2015/0318205 A1* | 11/2015 | Wang | H01L 21/32115 438/627 |
| 2016/0181117 A1* | 6/2016 | Arghavani | H01L 21/31116 438/712 |
| 2017/0221753 A1* | 8/2017 | Jia | H01L 21/32135 |
| 2018/0240701 A1* | 8/2018 | Jia | H01L 21/76883 |

OTHER PUBLICATIONS

Written Opinion of the International Searching Authority issued in PCT/CN2015/073088 dated Jun. 29, 2015 (3 pages).

* cited by examiner

METHOD FOR REMOVING BARRIER LAYER FOR MINIMIZING SIDEWALL RECESS

BACKGROUND OF THE INVENTION

1. Field of the Invention

The present invention generally relates to semiconductor manufacture, and more particularly relates to a method for removing barrier layer for minimizing sidewall recess.

2. The Related Art

According to famous Moore's law, the number of transistors on integrated circuits will be doubled about every eighteen months and the performance of the integrated circuits will also be doubled. The line width and spacing reduces and the density of the transistors increases, making copper and low k dielectric materials gradually become the mainstream technology of interconnection structures. However, the integration of copper and low k dielectric materials has some technical problems to solve in a practical application, such as barrier layer removal problem. It is known that the barrier layer is used for preventing the copper from diffusing into the low k dielectric materials in the interconnection structures. The barrier layer formed on non-recessed areas of the interconnection structures needs to remove after the copper formed on the non-recessed areas of the interconnection structures is removed.

At present, a traditional method for removing the barrier layer is CMP (chemical mechanical polishing). However, the CMP method has several deleterious effects on the underlying structures of the interconnection structures because of the relatively strong mechanical force involved. Especially, when the k value of the dielectric materials increasingly reduces, the mechanical force may cause permanent damage to the dielectric materials. The dielectric materials may be scratched by the CMP.

In order to overcome the disadvantages of the CMP, a more advanced technology, that is a thermal gas phase etching technology, is used for removing the barrier layer. The thermal gas phase etching technology utilizes chemical gas to react with the barrier layer at a certain temperature and pressure. More about thermal gas phase etching details can refer to patent application number PCT/CN2008/072059. Because there is no mechanical stress generated during the whole etching process, so there is no damage to the low k dielectric materials. But with the continuous decrease of the line width, new barrier layer materials, such as cobalt, ruthenium are instead of conventional barrier layer materials such as Ta, TaN, Ti, TiN, and the thickness of the barrier layer becomes thinner and thinner, both of which increase the difficulty of the thermal gas phase etching. During the thermal gas phase etching process, if the end point control is not accurate, besides the barrier layer on the non-recessed areas is removed, the barrier layer on the sidewall of recessed areas may also be etched. Once the barrier layer on the sidewall of the recessed areas is over etched, the copper in the recessed areas diffuses into the low k dielectric materials.

Referring to FIG. 1a and FIG. 1b, FIG. 1a and FIG. 1b are cross-sectional views illustrating introducing pure XeF2 gas to thermal gas phase etch the barrier layer on non-recessed areas and hard mask layer of an interconnection structure. In an exemplary embodiment, the interconnection structure includes a substrate 101, an isolation layer 102 formed on the substrate 101, a first dielectric layer 103 formed on the isolation layer 102, a second dielectric layer 104 formed on the first dielectric layer 103, a hard mask layer 105 formed on the second dielectric layer 104, recessed areas 108 formed on the hard mask layer 105, the second dielectric layer 104, the first dielectric layer 103 and the isolation layer 102, a barrier layer 106 formed on the hard mask layer 105, sidewall of the recessed areas 108 and bottom of the recessed areas 108, and a metal layer 107 formed on the barrier layer 106 and filling the recessed areas 108. In this embodiment, the metal layer 107 formed on the non-recessed areas has been removed and the top surface of the metal layer 107 in the recessed areas 108 is best to flush with the top surface of the second dielectric layer 104. Subsequently, the barrier layer 106 formed on the non-recessed areas is removed by using a thermal gas phase etching method. The thermal gas phase etching method utilizes pure XeF2 gas to remove the barrier layer. As shown in FIG. 1a, the pure XeF2 gas is introduced into an etching chamber where the interconnection structure is placed. At a certain temperature and pressure, the XeF2 gas is adsorbed on the surface of the interconnection structure. Then the XeF2 decomposes into F atoms. The F atoms react with the barrier layer, generating byproduct which is in gas phase. The byproduct is evacuated out of the etching chamber. At the beginning of the thermal gas phase etching, because the amount of the barrier layer on the non-recessed areas of the interconnection structure is large, the XeF2 gas molecules mainly concentrate on the non-recessed areas of the interconnection structure, so the barrier layer on the non-recessed areas of the interconnection structure is easily removed. Moreover, the material of the hard mask layer 105 generally selects TiN, TaN, etc, which can be removed by the XeF2 thermal gas phase etching. So after the barrier layer on the non-recessed areas of the interconnection structure is removed, the hard mask layer 105 is removed subsequently. While XeF2 thermal gas phase etching the hard mask layer 105, if the end point control is not accurate, the barrier layer 106 on the sidewall of the recessed areas 108 is over etched. As shown in FIG. 1b, after the hard mask layer 105 is completely removed, the XeF2 gas molecules mainly concentrate at the sidewall of the recessed areas 108, which results in the over etch of the barrier layer 106 on the sidewall of the recessed areas 108. Sidewall recesses 109 are formed between the metal layer 107 and the second dielectric layer 104 and the first dielectric layer 103.

SUMMARY

The present invention provides a method for removing barrier layer for minimizing sidewall recess. The method comprises the following steps: Introduce noble-gas-halogen compound gas and carrier gas into an etching chamber within which a thermal gas phase etching process is being performed for etching a barrier layer on non-recessed areas of an interconnection structure. Detect an end point of the thermal gas phase etching process, if the thermal gas phase etching process reaches the end point, then execute the next step, if the thermal gas phase etching process doesn't reach the end point, then return to the previous step. Stop introducing the noble-gas-halogen compound gas and the carrier gas into the etching chamber.

As described above, the present invention introduces the noble-gas-halogen compound gas and the carrier gas into an etching chamber performing a thermal gas phase etching process for etching the barrier layer on the non-recessed areas of the interconnection structure, thereby may improve or even overcome the sidewall recess issues.

BRIEF DESCRIPTION OF THE DRAWINGS

The present invention will be apparent to those skilled in the art by reading the following description of embodiments thereof, with reference to the attached drawings, in which:

FIG. 3c is an EDX view of area A shown in FIG. 3a.

FIG. 4c is an EDX view of area B shown in FIG. 4a.

DETAILED DESCRIPTION OF EMBODIMENTS

For solving the technical problems of the background, the present invention provides a method for removing barrier layer for minimizing sidewall recess. The method comprises: introducing noble-gas-halogen compound gas and carrier gas into an etching chamber for thermal gas phase etching the barrier layer on non-recessed areas of an interconnection structure which is placed in the etching chamber.

Figure 1A:
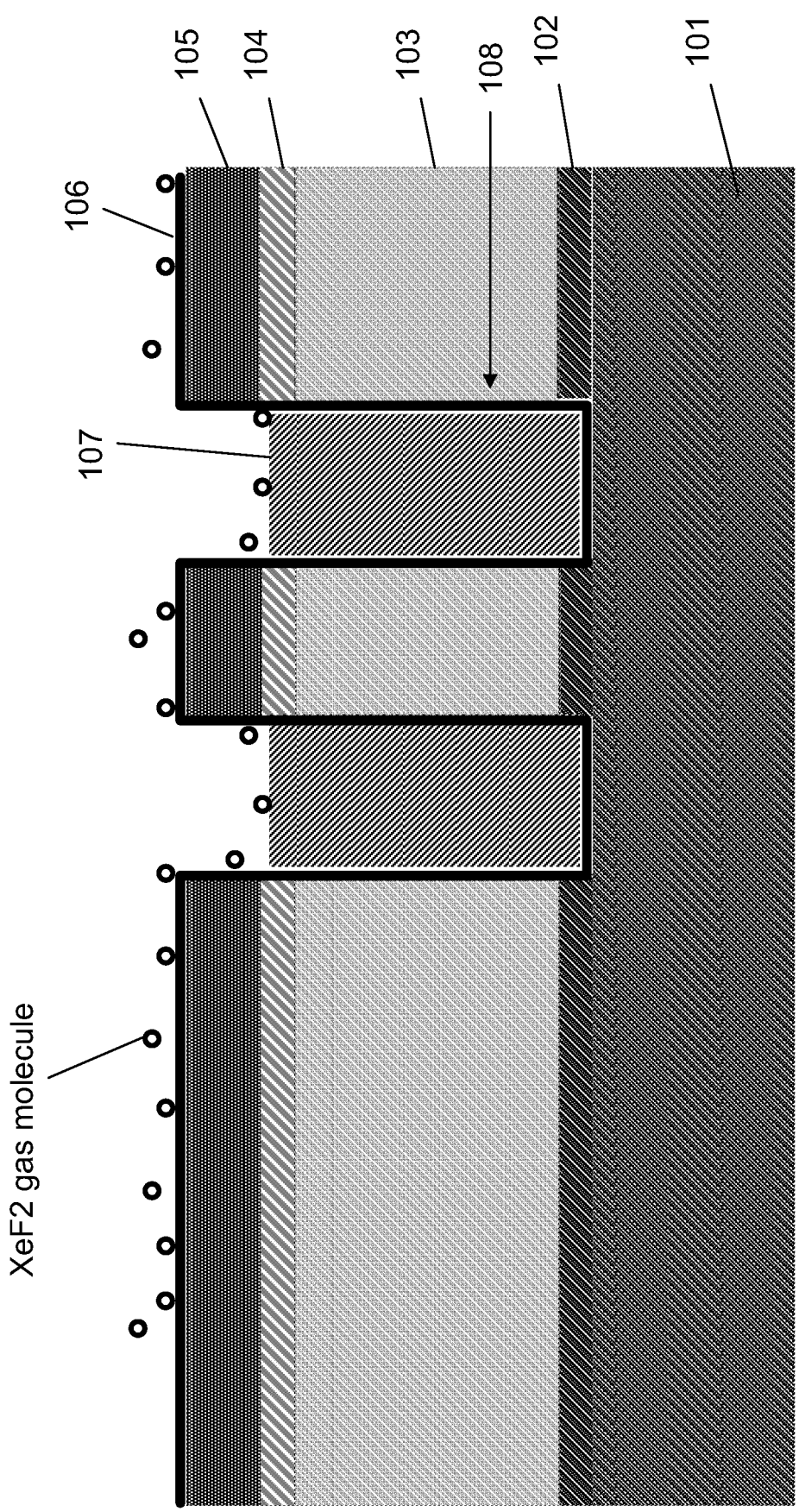
FIG. 1a and FIG. 1b are cross-sectional views illustrating introducing pure XeF2 gas to etch the barrier layer on non-recessed areas and hard mask layer of an interconnection structure.
Figure 1B:
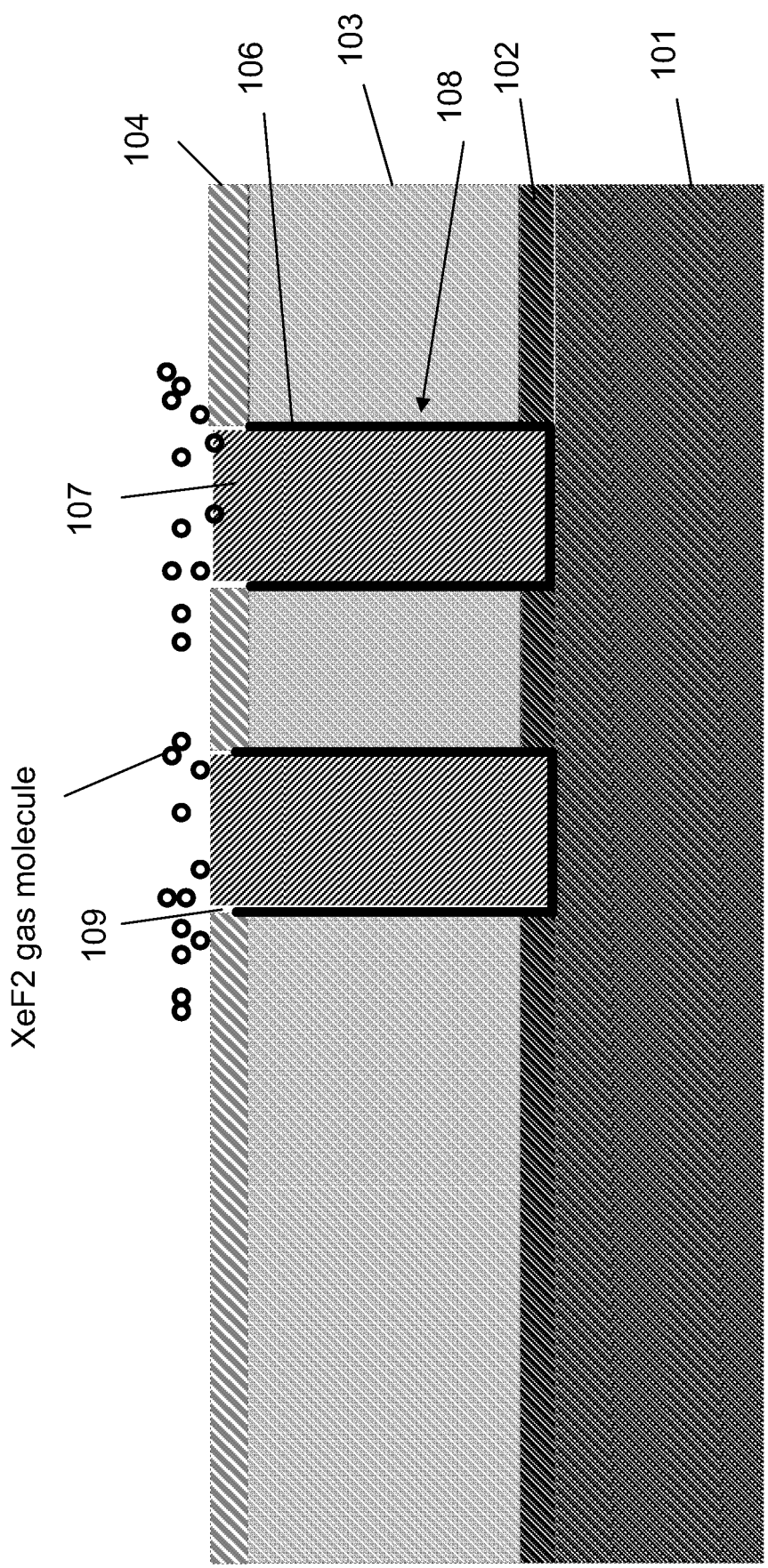
Figure 2A:
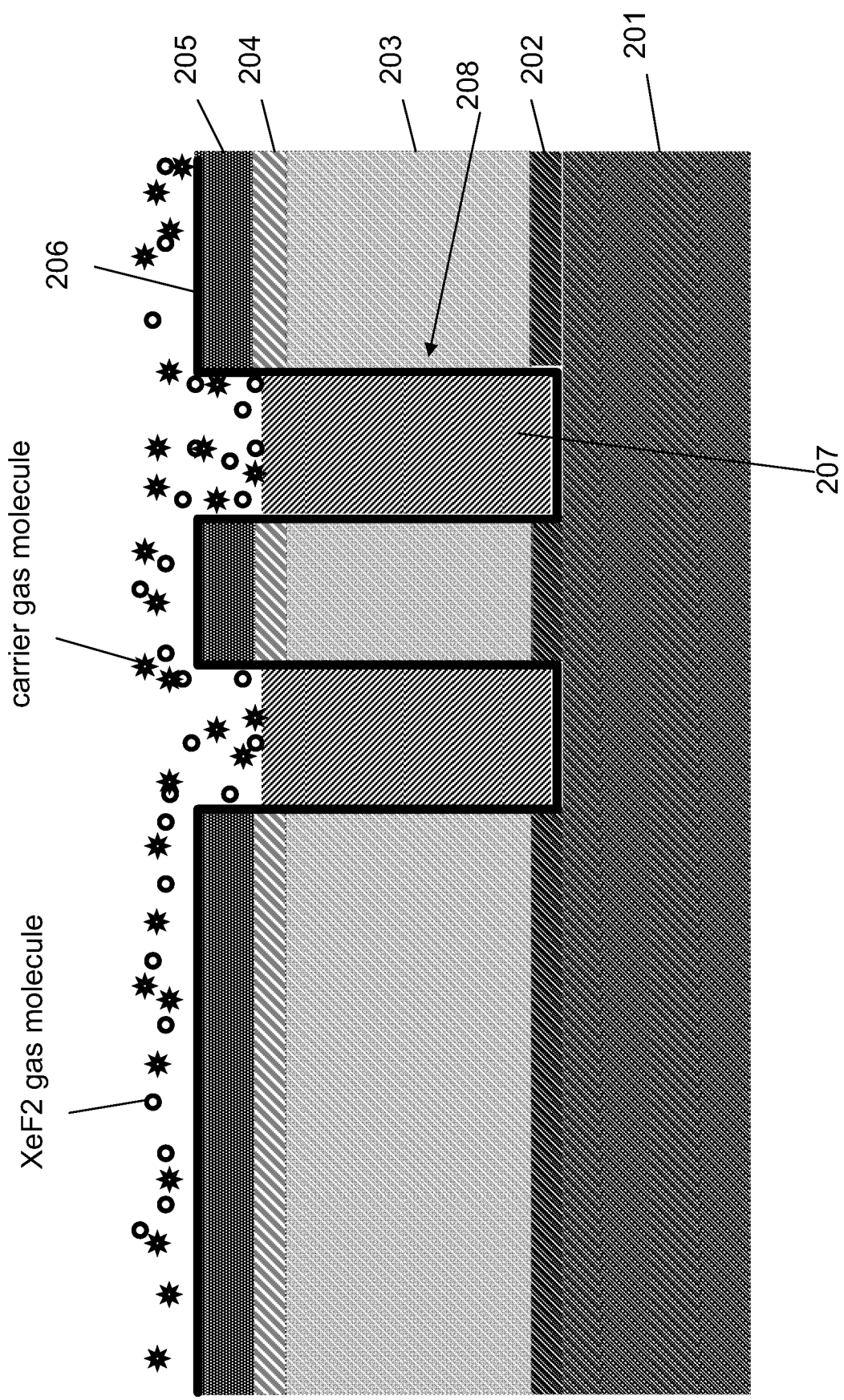
FIG. 2a and FIG. 2b are cross-sectional views illustrating introducing XeF2 gas and carrier gas to etch the barrier layer on non-recessed areas and hard mask layer of an interconnection structure.
Figure 2B:
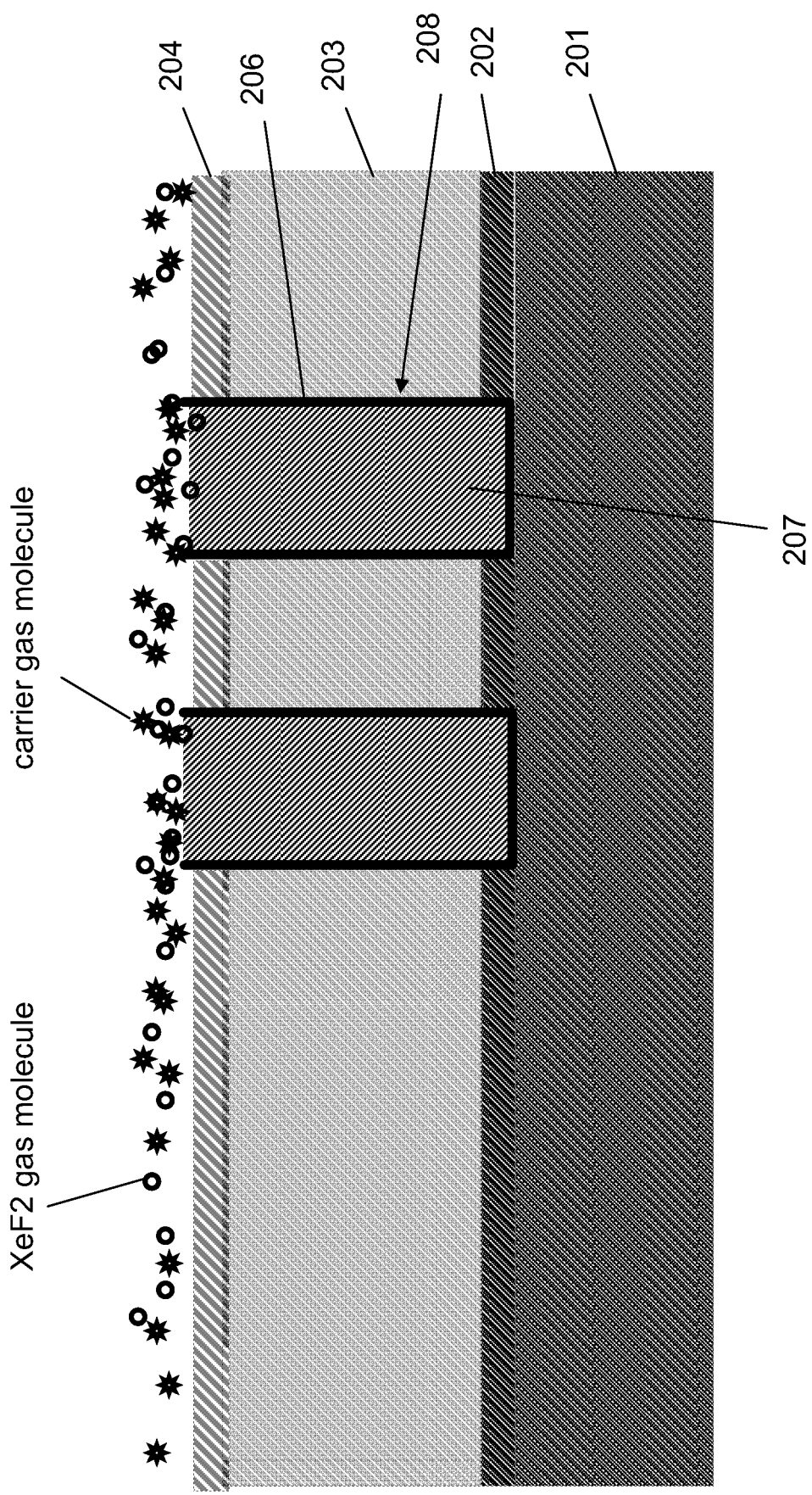

Referring to FIG. 2a and FIG. 2b, FIG. 2a and FIG. 2b are cross-sectional views illustrating introducing the noble-gas-halogen compound gas and the carrier gas to etch the barrier layer on the non-recessed areas and the hard mask layer of the interconnection structure. In an exemplary embodiment, the interconnection structure includes a substrate 201, an isolation layer 202 formed on the substrate 201, a first dielectric layer 203 formed on the isolation layer 202, a second dielectric layer 204 formed on the first dielectric layer 203, a hard mask layer 205 formed on the second dielectric layer 204, recessed areas 208 formed on the hard mask layer 205, the second dielectric layer 204, the first dielectric layer 203 and the isolation layer 202, a barrier layer 206 formed on the hard mask layer 205, sidewall of the recessed areas 208 and bottom of the recessed areas 208, and a metal layer 207 formed on the barrier layer 206 and filling the recessed areas 208. The isolation layer 202 can be SiCN. The first dielectric layer 203 can be a low k dielectric layer. The second dielectric layer 204 can be TEOS. The hard mask layer 205 can be TiN, TaN, W or WN. The barrier layer 206 can be Ta, TaN, Ti, TiN, Ru, Co, W, WN, Hf. The metal layer 207 can be copper. In this embodiment, the metal layer 207 formed on the non-recessed areas of the interconnection structure has been removed and the top surface of the metal layer 207 in the recessed areas 208 is best to flush with the top surface of the second dielectric layer 204. Subsequently, the barrier layer 206 formed on the non-recessed areas of the interconnection structure is removed. Because the material of the hard mask layer 205 can be removed by thermal gas phase etching, so in actual application, after the barrier layer 206 on the non-recessed areas of the interconnection structure is removed, the hard mask layer 205 is removed subsequently in the etching chamber.

For removing the barrier layer 206 formed on the non-recessed areas of the interconnection structure, the noble-gas-halogen compound gas and the carrier gas are introduced into the etching chamber where the interconnection structure is placed. Taking XeF2 and N2 for example, during the thermal gas phase etching process, when XeF2 is introduced to the etching chamber, at the same time, a certain amount of N2 is also introduced to the etching chamber, and the pressure of the etching chamber increases. Experiment data shows that when the flow of N2 is 9 times of the flow of XeF2, the etch rate will decrease about 18% compared with pure XeF2 gas. The etch rate decrease may be caused by the gas molecular collision between N2 molecules and XeF2 molecules. The gas molecular collision prevents the barrier layer 206 on the sidewall of the recessed areas 208 from over etching when the barrier layer 206 on the non-recessed areas is removed. Meanwhile, the pressure of the etching chamber can increase. The pressure of the etching chamber is higher, the gas molecular collision makes the mean free path of each gas become shorter. So the XeF2 gas is hard to enter into the sidewall of the recessed areas 208, avoiding the barrier layer 206 on the sidewall of the recessed areas 208 over etching.

The noble-gas-halogen compound gas can be one of the following: XeF2, XeF4, XeF6, KrF2, or the noble-gas-halogen compound gas can be a mixture of any combination of XeF2, XeF4, XeF6 or KrF2. The carrier gas can be selected from inert gas, such as one of Xe, Kr, Ar, Ne, He, or a mixture of any combination of Xe, Kr, Ar, Ne or He. The Xe is the most effective one, because Xe has the biggest molecular weight, which can provide a strong push force against the noble-gas-halogen compound gas into the sidewall of the recessed areas 208. In other embodiment, the carrier gas can also be selected as N2.

According to the above description, the molecular weight of the carrier gas is preferably bigger than the molecular weight of the noble-gas-halogen compound gas and the carrier gas doesn't react with the barrier layer 206. The larger molecular weight of the carrier gas is, the better the barrier layer over etch control effect it will have. At present, even though the molecular weight of the inert gas is smaller than the molecular weight of the noble-gas-halogen compound gas, but the Xe or Kr is a better choice. On the one hand, the molecular weight of Xe or Kr is bigger and closer to the molecular weight of the noble-gas-halogen compound gas, which can provide a strong push force against the noble-gas-halogen compound gas into the sidewall of the recessed areas 208. On the other hand, Xe or Kr as one of the reaction products can restrain the reaction between the barrier layer and the noble-gas-halogen compound gas. Although the etch rate of the barrier layer decreases, the barrier layer on the sidewall of the recessed areas over etch issue is overcome.

There are two experiments showing a good compare result for the present invention. In the two experiments, hard mask layer is removed by thermal gas phase etching.

Experiment 1

Figure 3A:
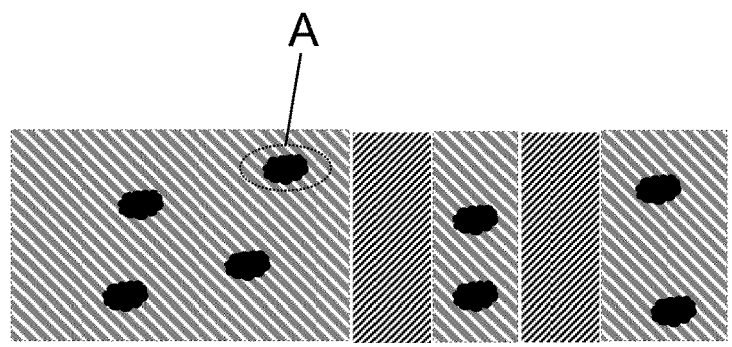
FIG. 3a is a top view illustrating after the barrier layer on the non-recessed areas and the hard mask layer of the interconnection structure is etched by introducing the pure XeF2 gas.
Figure 3B:
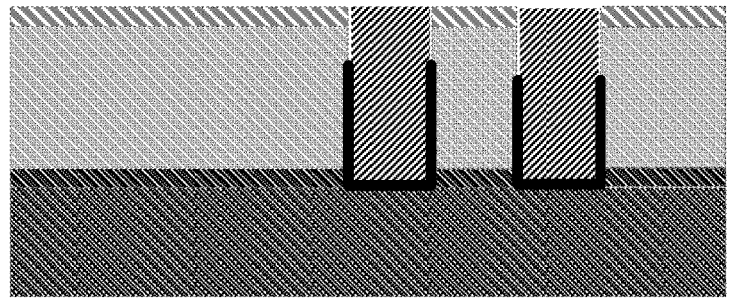
FIG. 3b is a cross-sectional view illustrating after the barrier layer on the non-recessed areas and the hard mask layer of the interconnection structure is etched by introducing the pure XeF2 gas.
Figure 3C:
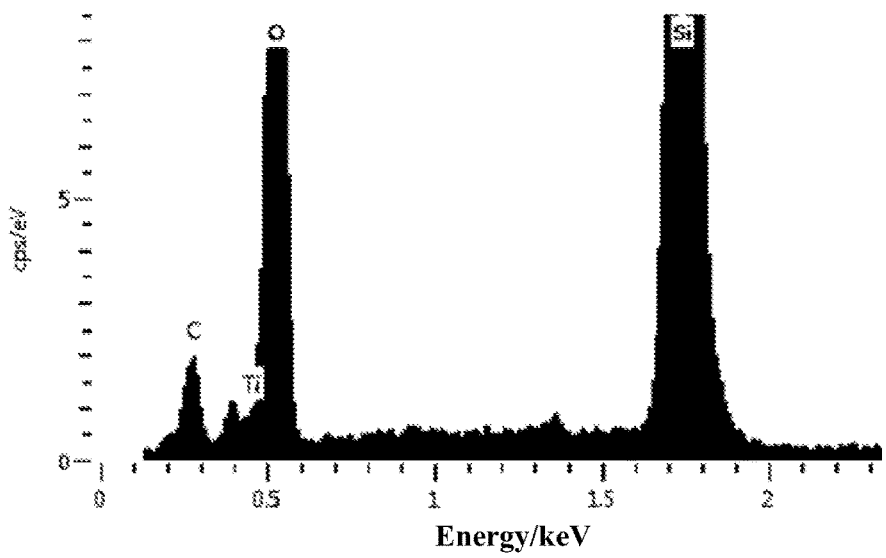

A sample is placed in the etching chamber. Pure XeF2 gas, which means no carrier gas, is introduced to the etching chamber. The flow of the pure XeF2 gas is 6 sccm. The pressure of the etching chamber is 0.8 Torr. The etch time is 80 s. The etch rate of the barrier layer of which material is Ta is 170 Å/min. FIG. 3a shows a top view after thermal gas phase etching. FIG. 3b is a cross-sectional view after thermal gas phase etching. FIG. 3c is an EDX view of area A shown in FIG. 3a. It can be clearly seen from FIG. 3c that there is still some residual hard mask layer, because Ti element which is the component of the hard mask layer is detected. It can be seen from FIG. 3b that the barrier layer on the sidewall of the recessed areas has been over etched. It can be imagined if the whole hard mask layer is completely removed, the barrier layer on the sidewall of the recessed areas will be etched more.

Experiment 2

Figure 4A:
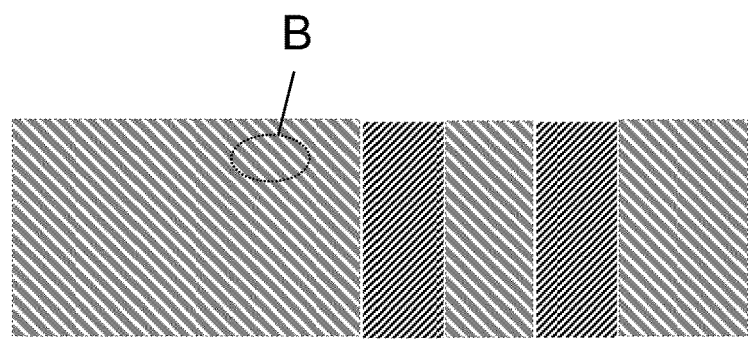
FIG. 4a is a top view illustrating after the barrier layer on the non-recessed areas and the hard mask layer of the interconnection structure is etched by introducing the XeF2 gas and the carrier gas.
Figure 4B:
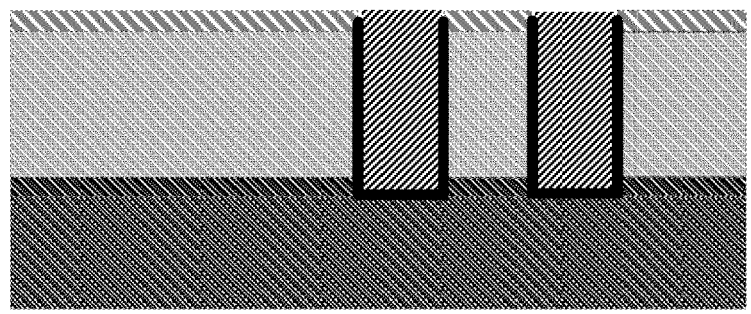
FIG. 4b is a cross-sectional view illustrating after the barrier layer on the non-recessed areas and the hard mask layer of the interconnection structure is etched by introducing the XeF2 gas and the carrier gas.
Figure 4C:
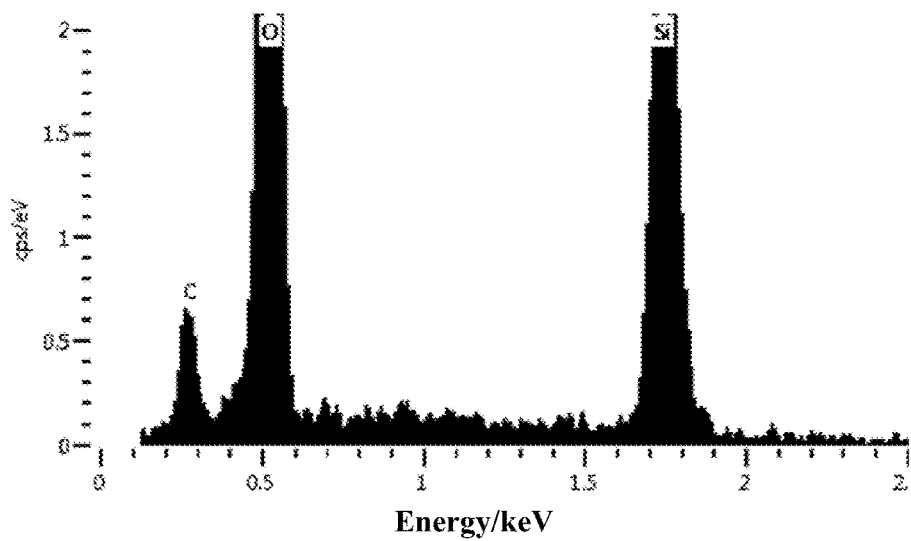

Another sample is placed in the etching chamber. XeF2 gas and N2 gas are introduced into the etching chamber. The flow of the XeF2 gas is 6 sccm. The flow of the N2 gas is 54 sccm. The pressure of the etching chamber is 4 Torr. The etch time is 97 s. The etch rate of the barrier layer of which material is Ta is 140 Å/min. In order to ensure the etch amount of the barrier layer is the same as the experiment 1, the etch time of the experiment 2 is longer than the etch time of the experiment 1. FIG. 4a shows a top view after thermal gas phase etching. FIG. 4b is a cross-sectional view after thermal gas phase etching. FIG. 4c is an EDX view of area B shown in FIG. 4a. It can be seen from FIG. 4c that there is no residual hard mask layer, because there is no hard mask layer material's element detected. The barrier layer on the non-recessed areas of the interconnection structure and the hard mask layer are completely removed. It can be seen from FIG. 4b that the barrier layer on the sidewall of the recessed areas is protected very well, and very little barrier layer on the sidewall of the recessed areas is etched to form sidewall recesses. The sidewall recesses are tiny and can be covered by the next process step, such as a cap layer (Co) deposition step.

Comparing the results of the experiment 1 and the experiment 2, it can be obtained when introducing the noble-gas-halogen compound gas to thermal gas phase etch the barrier layer on the non-recessed areas and the hard mask layer of the interconnection structure, at the same time introducing the carrier gas, can improve or even overcome the barrier layer on the sidewall of the recessed areas over etch issue. Although the etch rate decreases, the sidewall recess issue is well solved.

It is also found through experiments that the etching rate of thermal gas phase etching is proportional to the partial pressure of the noble-gas-halogen compound gas. That the noble-gas-halogen compound gas accounts for the proportion of the total amount of gas in the etching chamber is defined the partial pressure of the noble-gas-halogen compound gas. For example, there are two kinds of gas named A and B introduced to the etching chamber at the same time. The pressure of the etching chamber is C. The flow of the gas A is a. The flow of the gas B is b. The partial pressure of the gas A is $c*a/(a+b)$.

In the present invention, the end point control of the thermal gas phase etching is also important. Besides, because the hard mask layer 205 needs to remove and the material of the hard mask layer 205 generally selects TiN, the barrier layer 206 on the non-recessed areas of the interconnection structure and the hard mask layer 205 can be removed by thermal gas phase etching in the etching chamber. During the thermal gas phase etching process, the end point detection is continuously performed until the hard mask layer 205 is completely removed.

The present invention provides two methods for detecting the end point of the thermal gas phase etching process. One method is to use an Ellipsometer to detect the refractive index of the hard mask layer 205 and the second dielectric layer 204. Taking TiN and TEOS for example, the refractive index of TiN and TEOS is different. The refractive index of TiN is 1.8 and the refractive index of TEOS is 1.5. When the refractive index the Ellipsometer detects changes from 1.8 to 1.5, it means the thermal gas phase etching process reaches the end point. The introduction of noble-gas-halogen compound gas and the carrier gas are stopped and the noble-gas-halogen compound gas and the carrier gas are no longer introduced into the etching chamber.

The other method is to use an Ellipsometer to detect the thickness of the barrier layer 206 on the non-recessed areas of the interconnection structure and the hard mask layer 205 in real time. When the thickness of the hard mask layer 205 decreases to 0 Å, it means the thermal gas phase etching process reaches the end point. The introduction of noble-gas-halogen compound gas and the carrier gas are stopped and the noble-gas-halogen compound gas and the carrier gas are no longer introduced into the etching chamber.

Figure 5:
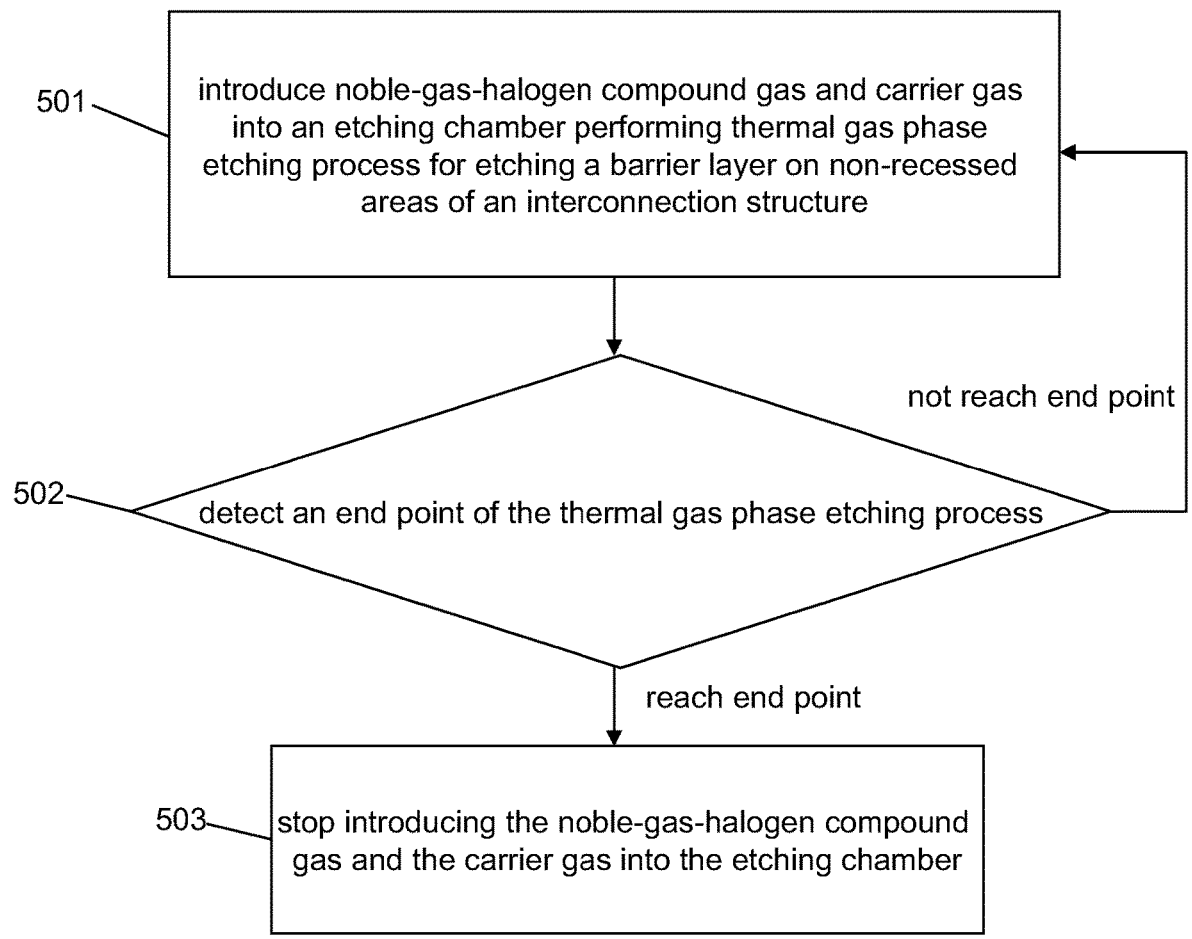
FIG. 5 is a flow chart illustrating a method for removing barrier layer for minimizing sidewall recess.

Referring to FIG. 5, a method for removing barrier layer for minimizing sidewall recess is illustrated. The method comprises the following steps:

Step 501: Introduce noble-gas-halogen compound gas and carrier gas into an etching chamber. A thermal gas phase etching process is performed within the etching chamber for etching a barrier layer on non-recessed areas of an interconnection structure.

Step 502: Detect an end point of the thermal gas phase etching process. If the thermal gas phase etching process reaches the end point, execute step 503. If the thermal gas phase etching process doesn't reach the end point, return to step 501.

Step 503: Stop introducing the noble-gas-halogen compound gas and the carrier gas into the etching chamber.

The flow rate ratio of the carrier gas and the noble-gas-halogen compound gas is 1:1 to 50:1.

The partial pressure of the noble-gas-halogen compound gas is 0.01-5 Torr.

The noble-gas-halogen compound gas is one of XeF2, XeF4, XeF6, KrF2 or a mixture of any combination of XeF2, XeF4, XeF6 or KrF2.

The carrier gas is inert gas which is one of Xe, Kr, Ar, Ne, He or a mixture of any combination of Xe, Kr, Ar, Ne or He. In other embodiments, the carrier gas is N2.

The material of the barrier layer is Ta, TaN, Ti, TiN, Ru, Co, W, WN or Hf.

In one embodiment, the interconnection structure includes a hard mask layer and at least one dielectric layer, the hard mask layer is removed by the thermal gas phase etching process, the step of detecting an end point of the thermal gas phase etching process further comprises using an Ellipsometer to detect the refractive index of the hard mask layer and the dielectric layer and determining whether the thermal gas phase etching process reaches the end point according to the refractive index detected by the Ellipsometer.

In another embodiment, the interconnection structure includes a hard mask layer, the hard mask layer is removed by the thermal gas phase etching process, the step of detecting an end point of the thermal gas phase etching process further comprises using an Ellipsometer to detect the thickness of the barrier layer on the non-recessed areas of the interconnection structure and the hard mask layer in real time and determining whether the thermal gas phase etching process reaches the end point according to the thickness of the hard mask layer detected by the Ellipsometer.

The interconnection structure is formed on a substrate. The temperature of the substrate is controlled at 20-500° C.

The pressure of the etching chamber is 0.01-50 Torr.

The molecular weight of the carrier gas is bigger than the molecular weight of the noble-gas-halogen compound gas.

In one embodiment, after the noble-gas-halogen compound gas is stopped introducing into the etching chamber, the carrier gas is still introduced into the etching chamber for a period of time, and then the carrier gas is stopped introducing into the etching chamber. In one embodiment, after the thermal gas phase etching process is completed, the noble-gas-halogen compound gas is stopped introducing into the etching chamber, however the carrier gas is still introduced into the etching chamber for a period of time, which purifies the etching chamber and takes away byproducts from the surface of the interconnection structure.

Figure 6:
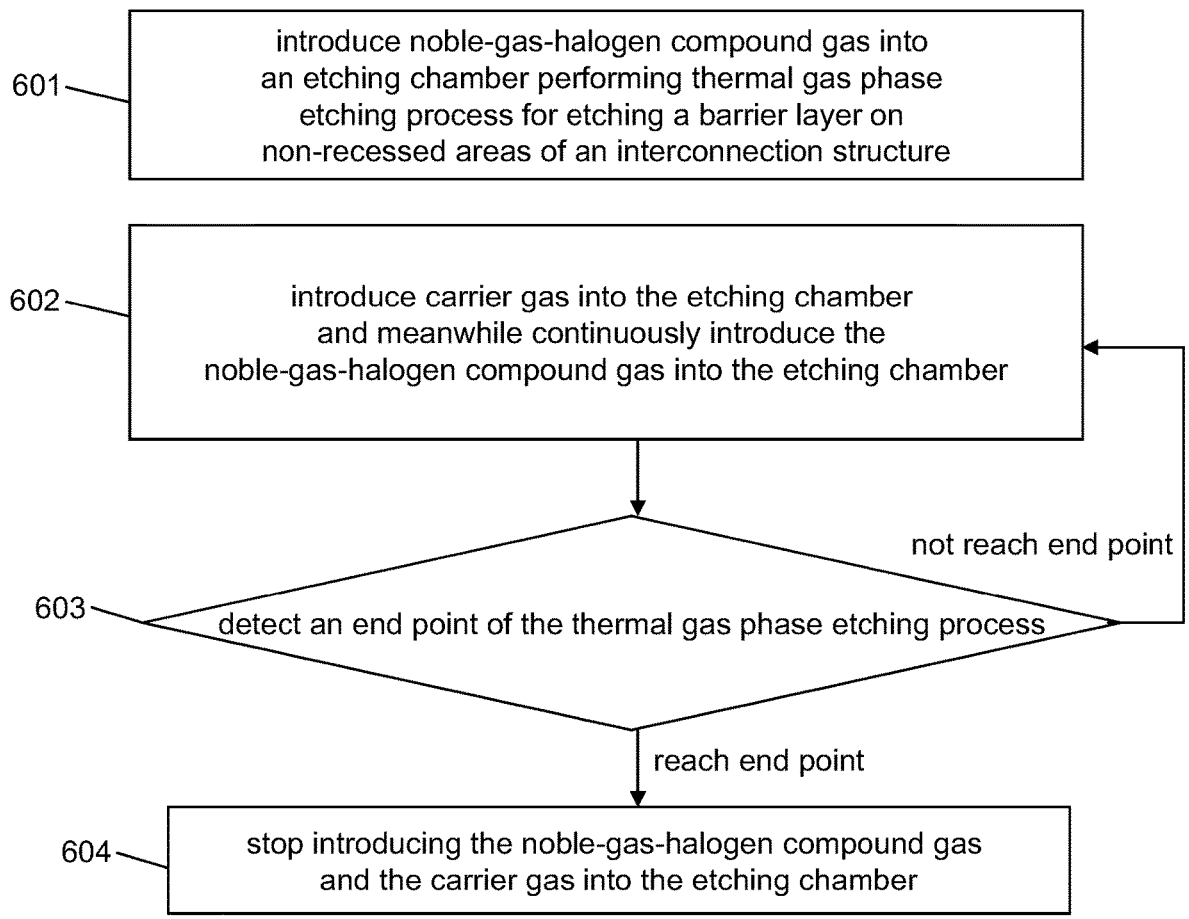
FIG. 6 is a flow chart illustrating another method for removing barrier layer for minimizing sidewall recess.

Referring to FIG. 6, another method for removing barrier layer for minimizing sidewall recess is illustrated. The method comprises the following steps:

Step 601: Introduce noble-gas-halogen compound gas into an etching chamber. A thermal gas phase etching process is performed within the etching chamber for etching a barrier layer on non-recessed areas of an interconnection structure.

Step 602: Introduce carrier gas into the etching chamber, and meanwhile continuously introduce the noble-gas-halogen compound gas into the etching chamber. The thermal gas phase etching process for etching the barrier layer on the non-recessed areas of the interconnection structure is continued within the etching chamber.

Step 603: Detect an end point of the thermal gas phase etching process. If the thermal gas phase etching process reaches the end point, execute step 604. If the thermal gas phase etching process doesn't reach the end point, return to step 602.

Step 604: Stop introducing the noble-gas-halogen compound gas and the carrier gas to the etching chamber.

When the thermal gas phase etching process is approximating the end point, the flow of the carrier gas is increased.

In one embodiment, before introducing the carrier gas into the etching chamber, the noble-gas-halogen compound gas is introduced into the etching chamber for a period of time, which may improve the etch efficiency.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

The invention claimed is:

1. A method for removing barrier layer for minimizing sidewall recess, comprising:

introducing a noble-gas-halogen compound and a carrier gas into an etching chamber within which a thermal gas phase etching process is being performed for etching a barrier layer on non-recessed areas of an interconnection structure;

monitoring an end point of the thermal gas phase etching process, executing a next step if the thermal gas phase etching process reaches the end point; returning to the previous step if the thermal gas phase etching process doesn't reach the end point;

stopping introducing the noble-gas-halogen compound and the carrier gas into the etching chamber, wherein the carrier gas is Xe or Kr, and the noble-gas-halogen compound is selected from the group consisting of $XeF_2$, $XeF_4$, $XeF_6$, and $KrF_2$.

2. The method of claim 1, wherein the flow rate ratio of the carrier gas and the noble-gas-halogen compound is 1:1 to 50:1.

3. The method of claim 1, wherein the partial pressure of the noble-gas-halogen compound is 0.01-5 Torr.

4. The method of claim 1, wherein the noble-gas-halogen compound is a mixture of at least two of the following: $XeF_2$, $XeF_4$, $XeF_6$ or $KrF_2$.

5. The method of claim 1, wherein the material of the barrier layer is a layer of Ta, TaN, Ti, TiN, Ru, Co, W, WN or Hf.

6. The method of claim 1, wherein the interconnection structure is formed on a substrate, the temperature of the substrate is 20-500° C.

7. The method of claim 1, wherein the pressure of the etching chamber is 0.01-50 Torr.

8. The method of claim 1, wherein the interconnection structure includes a hard mask layer and at least one dielectric layer, the hard mask layer is removed by the thermal gas phase etching process, the step of monitoring the end point of the thermal gas phase etching process further comprises using an Ellipsometer to detect the refractive index of the hard mask layer and the dielectric layer and determining whether the thermal gas phase etching process reaches the end point according to the refractive index detected by the Ellipsometer.

9. The method of claim 1, wherein the interconnection structure includes a hard mask layer, the hard mask layer is removed by the thermal gas phase etching process, the step of monitoring the end point of the thermal gas phase etching process further comprises using an Ellipsometer to detect the thickness of the barrier layer on the non-recessed areas of the interconnection structure and the hard mask layer in real time and determining whether the thermal gas phase etching process reaches the end point according to the thickness of the hard mask layer detected by the Ellipsometer.

10. The method of claim 1, wherein after stopping introducing the noble-gas-halogen compound into the etching chamber, keep introducing the carrier gas into the etching chamber for a period of time, and then stopping introducing the carrier gas into the etching chamber.

11. The method of claim 1, wherein the monitoring of the end point of the thermal gas phase etching process is continuously performed.

12. The method of claim 1, wherein before introducing the carrier gas into the etching chamber, the noble-gas-halogen compound is introduced into the etching chamber for a period of time.

13. The method of claim 12, wherein the flow of the carrier gas is increased when the thermal gas phase etching process is approximating the end point.

* * * * *